United States Patent
Zheng et al.

(10) Patent No.: US 10,157,657 B2
(45) Date of Patent: Dec. 18, 2018

(54) SELECTIVE REFRESH WITH SOFTWARE COMPONENTS

(71) Applicant: Rambus Inc., Sunnyvale, CA (US)

(72) Inventors: Hongzhong Zheng, Sunnyvale, CA (US); James Tringali, Los Altos, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 492 days.

(21) Appl. No.: 13/975,873

(22) Filed: Aug. 26, 2013

(65) Prior Publication Data

US 2014/0068172 A1    Mar. 6, 2014

Related U.S. Application Data

(60) Provisional application No. 61/693,911, filed on Aug. 28, 2012.

(51) Int. Cl.
| | | |
|---|---|---|
| *G11C 11/00* | (2006.01) | |
| *G11C 11/406* | (2006.01) | |
| *G06F 12/08* | (2016.01) | |
| *G06F 12/1009* | (2016.01) | |

(52) U.S. Cl.
CPC ........... *G11C 11/406* (2013.01); *G06F 12/08* (2013.01); *G06F 12/1009* (2013.01)

(58) Field of Classification Search
None
See application file for complete search history.

(56) References Cited

U.S. PATENT DOCUMENTS

| | | | |
|---|---|---|---|
| 5,469,559 A | | 11/1995 | Parks et al. |
| 5,856,940 A | * | 1/1999 | Rao ................. G11C 8/16 365/149 |
| 6,542,958 B1 | | 4/2003 | Song |
| 7,679,980 B2 | | 3/2010 | Happ et al. |
| 7,746,718 B2 | | 6/2010 | Eguchi et al. |
| 8,326,353 B1 | * | 12/2012 | Nasserbakht ....... G06F 15/7807 455/556.1 |
| 2003/0028711 A1 | * | 2/2003 | Woo ................. G06F 1/3225 711/106 |
| 2007/0011687 A1 | * | 1/2007 | Ilik .................. G06F 9/546 719/313 |

(Continued)

OTHER PUBLICATIONS

Chow, Jim, "Shredding Your Garbage: Reducing Lifetime Through Secure Deallocation," Proceedings of the 14th USENIX Security Symposium, Jul. 31-Aug. 5, 2005, pp. 331-346. 16 pages.

(Continued)

*Primary Examiner* — David Yi
*Assistant Examiner* — Craig S Goldschmidt
(74) *Attorney, Agent, or Firm* — Lance Kreisman; Peninsula Patent Group (57) ABSTRACT

A method of refreshing a memory is disclosed. The method includes accessing from active memory an active memory map. The active memory map is generated by software and identifies addresses corresponding to the active memory and associated refresh criteria for the addresses. The refresh criteria are evaluated for a portion of the active memory, and an operation initiated to refresh a portion of the active memory is based on the refresh criteria.

20 Claims, 8 Drawing Sheets

(56) References Cited

U.S. PATENT DOCUMENTS

2007/0180187 A1* 8/2007 Olson ................. G06F 12/10
  711/106
2011/0111865 A1* 5/2011 Cadima ................. G07F 17/32
  463/43

OTHER PUBLICATIONS

Isen, Ciji et al., "ESKIMO—Energy Savings Using Semantic Knowledge of Inconsequential Memory Occupancy for DRAM Subsystem," MICRO '09, Dec. 12-16, 2009, New York, NY. 10 pages.
Moshnyaga et al., "Reducing Energy of DRAM/Flash Memory System by OS-Controlled Data Refresh," ISCAS 2007, IEEE International Symposium on Circuits and Systems, May 27-30, 2007, pp. 2108-2111. 4 pages.

* cited by examiner

SELECTIVE REFRESH WITH SOFTWARE COMPONENTS

RELATED APPLICATIONS

This application claims the benefit of priority under 35 U.S.C. 119(e) to Provisional Application Ser. No. 61/693,911, filed Aug. 28, 2012, entitled SELECTIVE REFRESH WITH SOFTWARE COMPONENTS, which is incorporated by reference in its entirety for all purposes.

TECHNICAL FIELD

The disclosure herein relates to memory systems, and more specifically to methods and apparatus for memory refresh operations.

BACKGROUND

Memory systems typically employ large amounts of DRAM memory as main memory. At the transistor level, a DRAM cell is a capacitor structure, with the capability of maintaining a charge representing a "bit" on the order of approximately 64 mS. To maintain the charge, the cell needs to be periodically refreshed—generally involving a read and write operation every 64 mS. Conventionally, the entire DRAM array is blindly refreshed even though much of the memory may not be active. Conventional refresh operations can consume as much as a third of the power consumption associated with the memory.

While DRAMs traditionally employ hardware-based refresh operations at very high rates, a variety of other memory technologies provide fast access times similar to DRAM, but with much slower refresh rate requirements. For example, some forms of RRAM can operate with refresh rates on the order of seconds. Slower refresh rates can also be beneficial for memory technologies that are susceptible to repetitive write operations that can degrade cell retention.

Thus, the need exists for an improved refresh scheme for memory systems that can minimize power dissipation and take advantage of reduced-rate refresh requirements.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of methods and apparatus for refreshing a memory are disclosed. In one embodiment, a method of refreshing a memory includes accessing from active memory an active memory map. The active memory map is generated by software and identifies addresses corresponding to the active memory and associated refresh criteria for the addresses. The refresh criteria are evaluated for a portion of the active memory, and an operation initiated to refresh a portion of the active memory is based on the refresh criteria. In this manner, low-power selective refresh operations may be successfully carried out by a software-based refresh scheme.

In a further embodiment, a method of managing memory refresh operations is disclosed. The method involves a first mode of operation that includes generating an active memory map of the memory with software. The active memory map has addresses corresponding to active memory allocated by the software, and is stored in a location within the active memory. The stored active memory map is accessed to evaluate refresh criteria for a portion of the active memory. Based on the refresh criteria, an operation to refresh a portion of the active memory is initiated. Other embodiments include a self-refresh mode of operation in addition to the first mode of operation where externally generated refresh instructions are not issued to refresh the memory.

Another embodiment presented herein relates to a memory device that includes storage cells operable to store an active memory map. Software generates the active memory map which identifies addresses of active memory in the memory device. In a first refresh mode of operation, the storage cells are operable, in response to refresh commands based on operations initiated by the software, to selectively refresh a portion of the active memory corresponding to the active memory map. In a second mode of operation, the storage cells are operable, in response to self-refresh commands, to selectively refresh a portion of the active memory corresponding to a loaded bitmap version of the active memory map.

In yet a further embodiment, a memory controller is disclosed that includes a host interface, decoder circuitry, and a memory interface. The host interface is operable to receive refresh instructions that are based on an active memory map of a memory. The active memory map being generated by operating system software under control of a host device. The decoder circuitry generates memory device address-specified refresh command signals based on the refresh instructions. The memory interface issues the refresh command signals to the memory to carry out selective refresh operations based on the active memory map.

Figure 1:
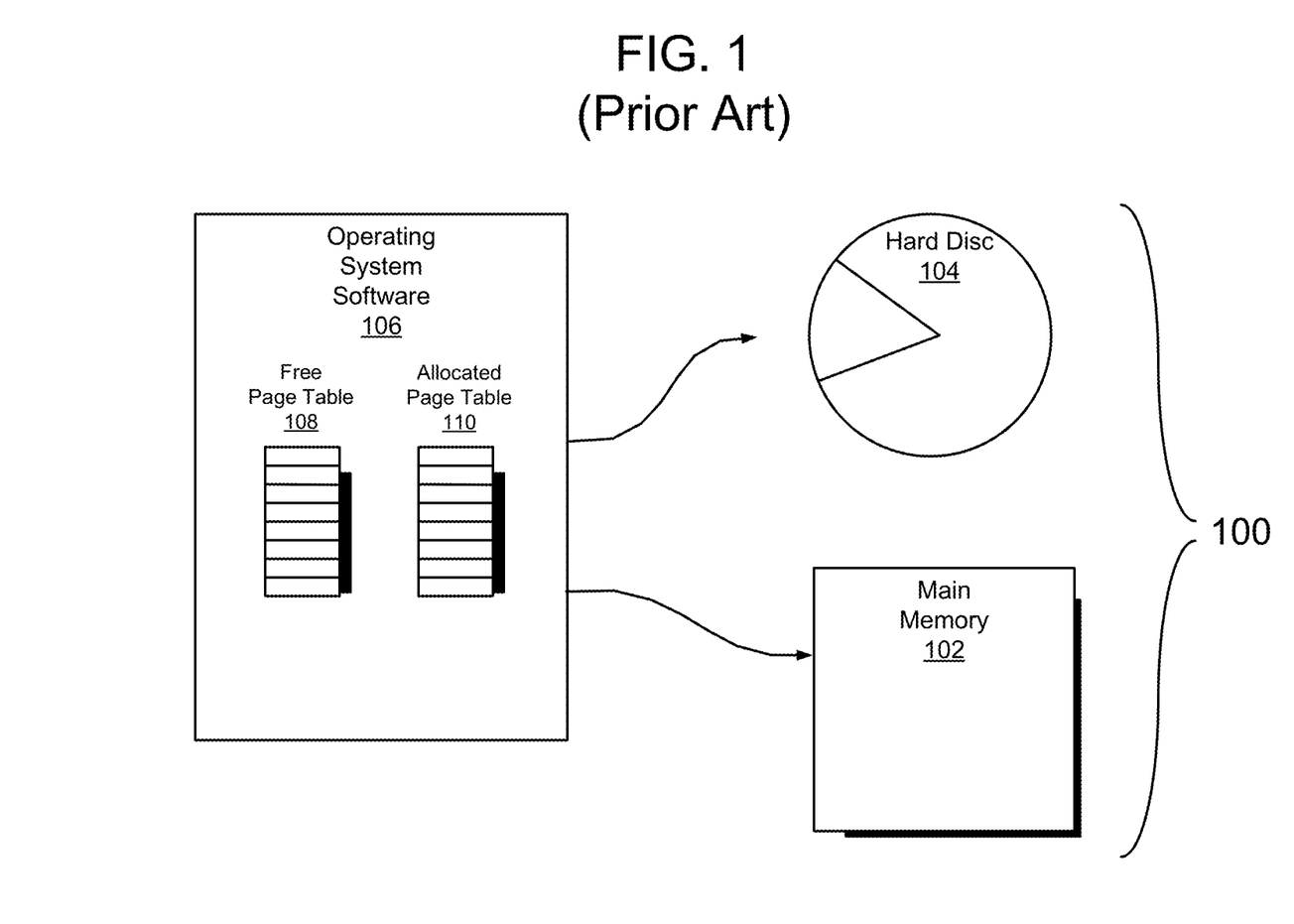
FIG. 1 illustrates a block diagram representing how conventional operating system software tracks active memory usage in a memory.

FIG. 1 illustrates a block diagram representing a memory management scheme, generally designated 100, that is often employed by modern computing systems to manage system memory. A total system memory may involve a combination of virtual and physical memory. The physical memory is generally in the form of a main memory 102, and occasionally supplemented virtually through interaction with a bulk memory 104. Moreover, a system's main memory 102 is often not fully allocated during system operation.

To address the various possible memory configurations, a software-based memory manager is often used to monitor and map how the physical memory is allocated within the computing system's total memory. The portion of the system memory realized by the main memory 102 usually includes a quickly accessible collection of volatile memory devices, while the bulk memory 104 often takes the form of a hard disc 104 or other mass media storage device.

Further referring to FIG. 1, operating system software 106 manages the use of the main memory 102 and tracks various statistics and other information associated with the main memory 102. The allocated memory is commonly referred to herein as "active memory." Other information tracked by the operating system software 106 includes the type of main memory in the system (such as a specific form of DRAM, flash, or other memory technology), the active memory capacity, and other parameters. The system memory information is organized into page tables, such as a free page table 108 and an allocated page table 110. A "page" is a unit of memory from the perspective of the operating system software. The page table information is stored in the main memory 102 during system operation and is retrievable upon request from the operating system software or other application or process.

Figure 2:
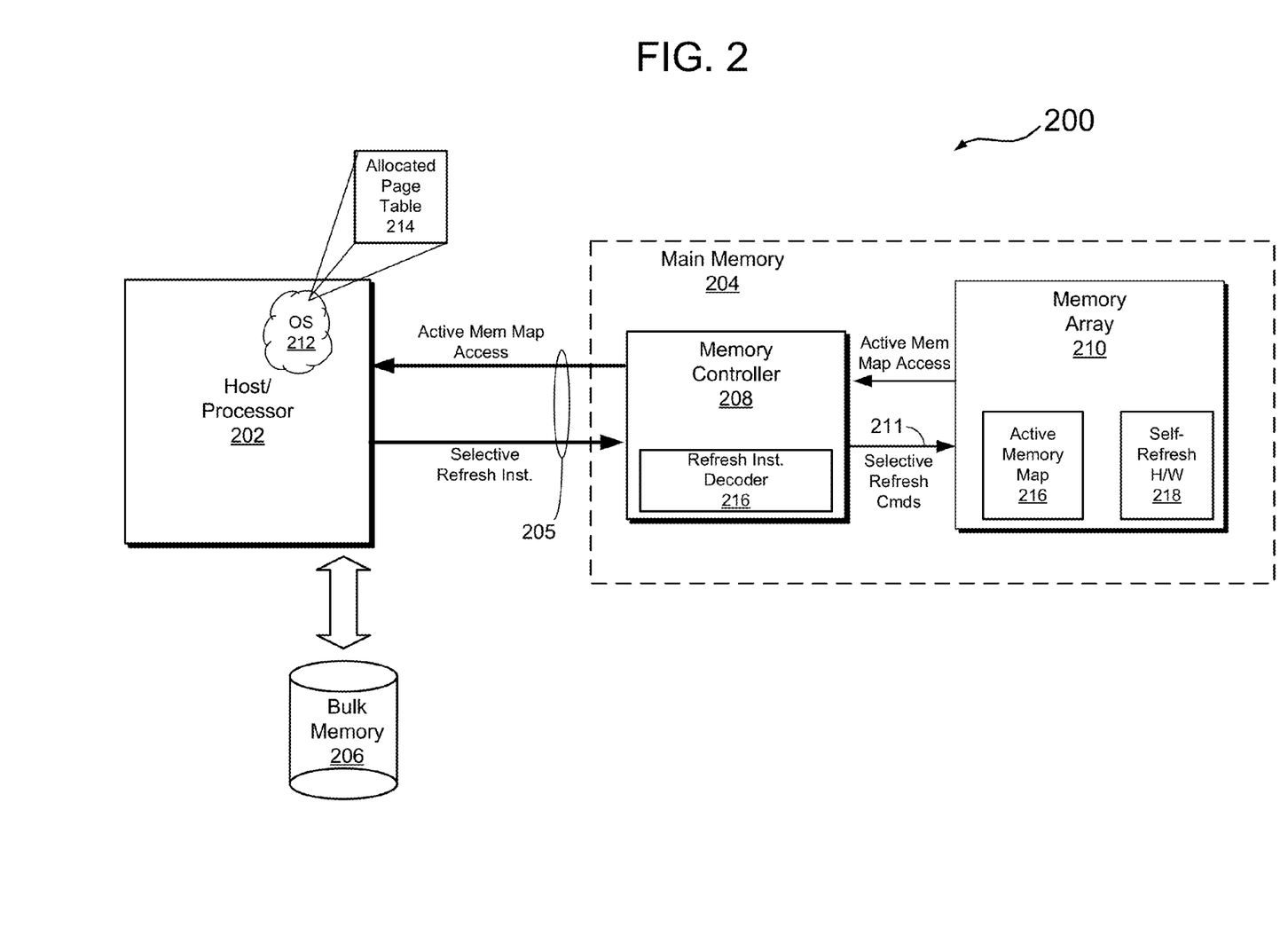
FIG. 2 illustrates a block diagram of a memory refresh system according to one embodiment.

Referring now to FIG. 2, a computing system, generally designated 200, is shown that employs a unique refresh method for memory used in a main memory 204 by accessing allocated page table information such as that noted above with respect to FIG. 1. The system 200 generally includes a host device 202, such as a general purpose processor coupled to the system main memory 204 via a system bus 205. Bulk memory 206 in the form of a hard disc interfaces with the host 202 as is well-known in the art.

Further referring to FIG. 2, operating system (OS) software 212 generally manages the hardware resources of the computing system 200. In one embodiment, the operating system software 212 generates and maintains an allocated page table 214 that identifies the allocated memory, or "active memory", in the main memory 204. The allocated page table 214 thus serves as a mapping of the physical memory actually used during system operation. With this information readily accessible, low-power refresh operations to selectively refresh only the allocated main memory may be realized.

With continued reference to FIG. 2, the main memory 204 includes a memory controller 208 that interfaces with a memory array 210. The memory controller 208 may be realized as a discrete integrated circuit (IC), or formed on the host 202 as an on-chip controller, or packaged with the memory array 210 in a system-in-package (SIP) configuration. A refresh instruction decoder 216 is included in the memory controller 208 to decode refresh instructions received from the host 202, and generate and issue corresponding refresh commands to the memory array 210 along a command path 211, as more fully described below.

The memory array 210 in one embodiment takes the form of one or more integrated circuit memory devices. Data associated with the allocated page table 214 is stored in a portion of the memory array 210 as an active memory map 216. The memory devices are formed in accordance with memory cell technology that provides storage cells which exhibit relatively long retention times. In specific embodiments, the retention times are at least 650 ms. More generally, the retention time is of a duration longer than a time interval necessary to allow the operating system software 212 to issue refresh instructions to the memory controller 208 to subsequently issue refresh commands to the memory devices to refresh the active memory in the memory array 210 based on the retrieved map.

In addition to allowing for refresh operations managed by the external operating system software 212, each memory device includes self-refresh hardware 218, explained in further detail below, to allow each memory device to enter and exit a low-power self-refresh mode of operation. When this mode is initiated, information based on the active memory map 216 is bitmapped into bitmap portions of each device for access by each memory device during self-refresh. Selective self-refresh operations are then enabled to refresh only those portions of active memory in each memory device, as mapped by the bitmapping. Further details regarding this mode of operation are explained in the text that follows.

Figure 3:
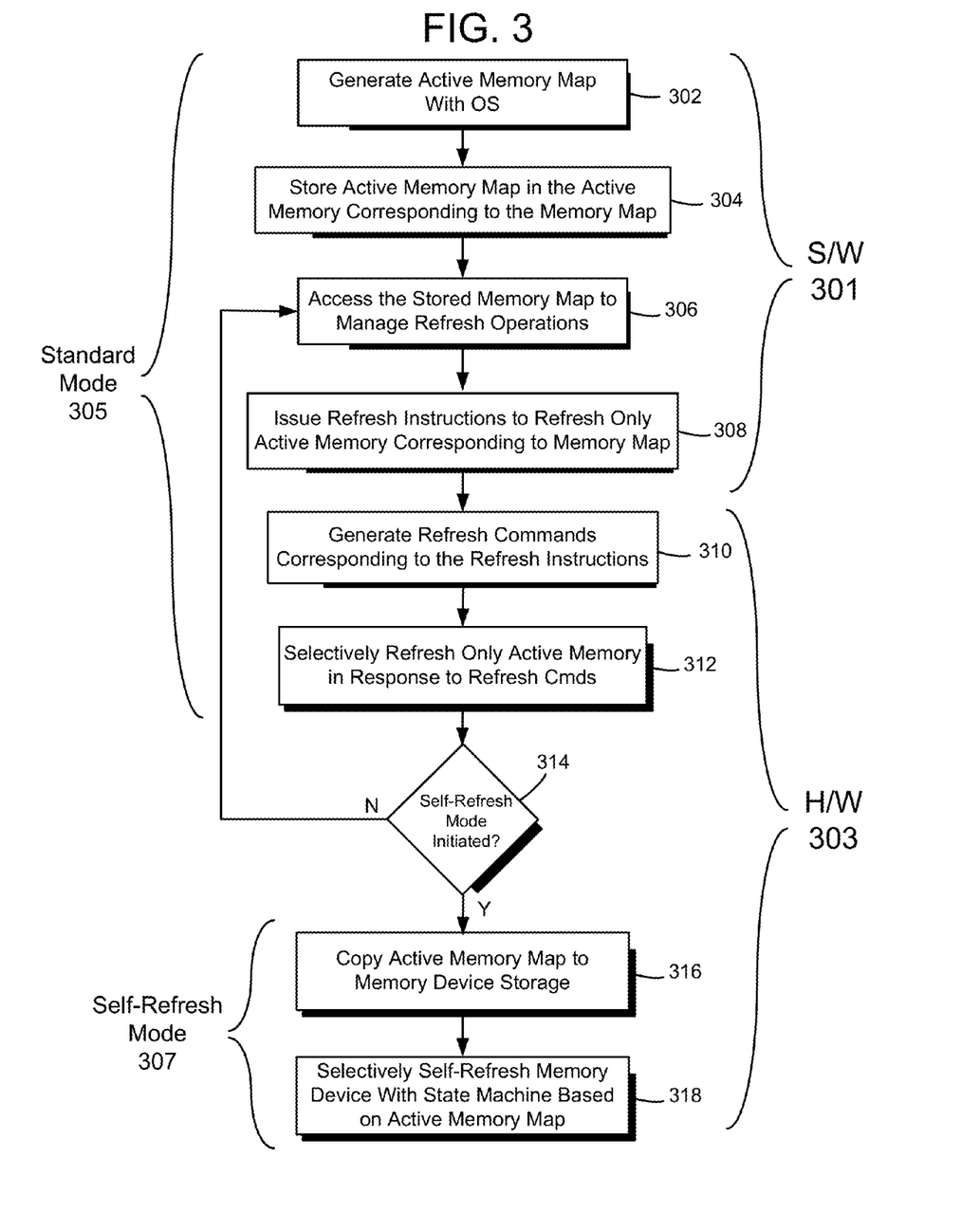
FIG. 3 illustrates a high-level process flow of the system of FIG. 2.

In operation, the system 200 of FIG. 2 carries out steps consistent with the flowchart illustrated in FIG. 3 to selectively refresh only the portion of system memory that is "active" or allocated as indicated by the active memory map 216 that is managed by the operating system software 212. At a high-level, the steps involve various software functions 301, such as those identified by steps 302-308, and hardware functions 303 carried out by steps 310, 312, 314, 316 and 318. Further, multiple modes of operation are provided as noted above, relating to both a standard refresh mode 305 set forth in steps 302, 304, 306, 308, 310, 312, and a self-refresh mode 307 set forth in steps 316 and 318.

Referring to FIG. 3, at system start-up or initialization, the operating system software 212 determines the system memory parameters, and identifies "pages" of the main memory 210 that will be "active." As noted above, a "page" is a quantity of memory from the perspective of the operating system software 212, and not to be confused with a physical page (or row) of a memory device in the memory array 210. Information pertaining to the "active memory" is mapped to the physical memory space, at step 302, and stored in a portion of the memory array 210 as the active memory map 216, at step 304.

Further referring to FIG. 3, refreshing the memory array 210 during the standard refresh mode of operation 305 involves accessing the stored active memory map 216 to manage refresh operations, at step 306. More details relating to this step are explained below. Once the active memory map 216 is accessed (essentially the allocated page table information), the operating system software 212 determines locations of active memory that need to be refreshed during a given time interval, and issues refresh instructions to the memory controller 208 to refresh only the active memory corresponding to the active memory map 216, at step 308. Up to this point, steps 302-308 are managed by the operating system software 212 for the standard refresh mode of operation 305. Generally, at least one refresh instruction is generated by one map table access. The table is sorted in time order of the pages, and the table might be accessed multiple times until all refresh instructions of the pages reaching the refresh deadline are issued.

With continued reference to FIG. 3, the memory controller 208 receives the refresh instructions issued by the operating system software 212 and decodes the instructions into address-specified refresh commands that the memory array 210 can respond to, at step 310. The refresh commands are sent to the memory array 210 along the command path 211, and the address-specified portions of the memory array 210 are refreshed in response to the commands, at step 312. As noted above, the refresh commands involve appropriate memory requests that generally read the contents of the active memory, and re-write the contents back into the memory. Since only the portions of the memory array 210 that are actually allocated, or "active", are refreshed, power dissipation associated with refresh operations may be significantly reduced.

Following the refresh operation, the operating system software 212 determines whether the self-refresh mode 307 should be initiated based on predetermined self-refresh criteria, at step 314. If the self-refresh mode 307 is not initiated, then the next standard refresh operation begins with a subsequent access of the active memory map 216 at step 306. If the self-refresh mode 307 is initiated, at step 314, then the active memory map 216 is copied to a portion of each memory device, at step 316, and a hardware-based self-refresh scheme employed. In one embodiment, this includes, for example, a state machine on each memory device to selectively refresh the portion of the memory array 210 corresponding to the loaded memory map, at step 318.

Figure 4:
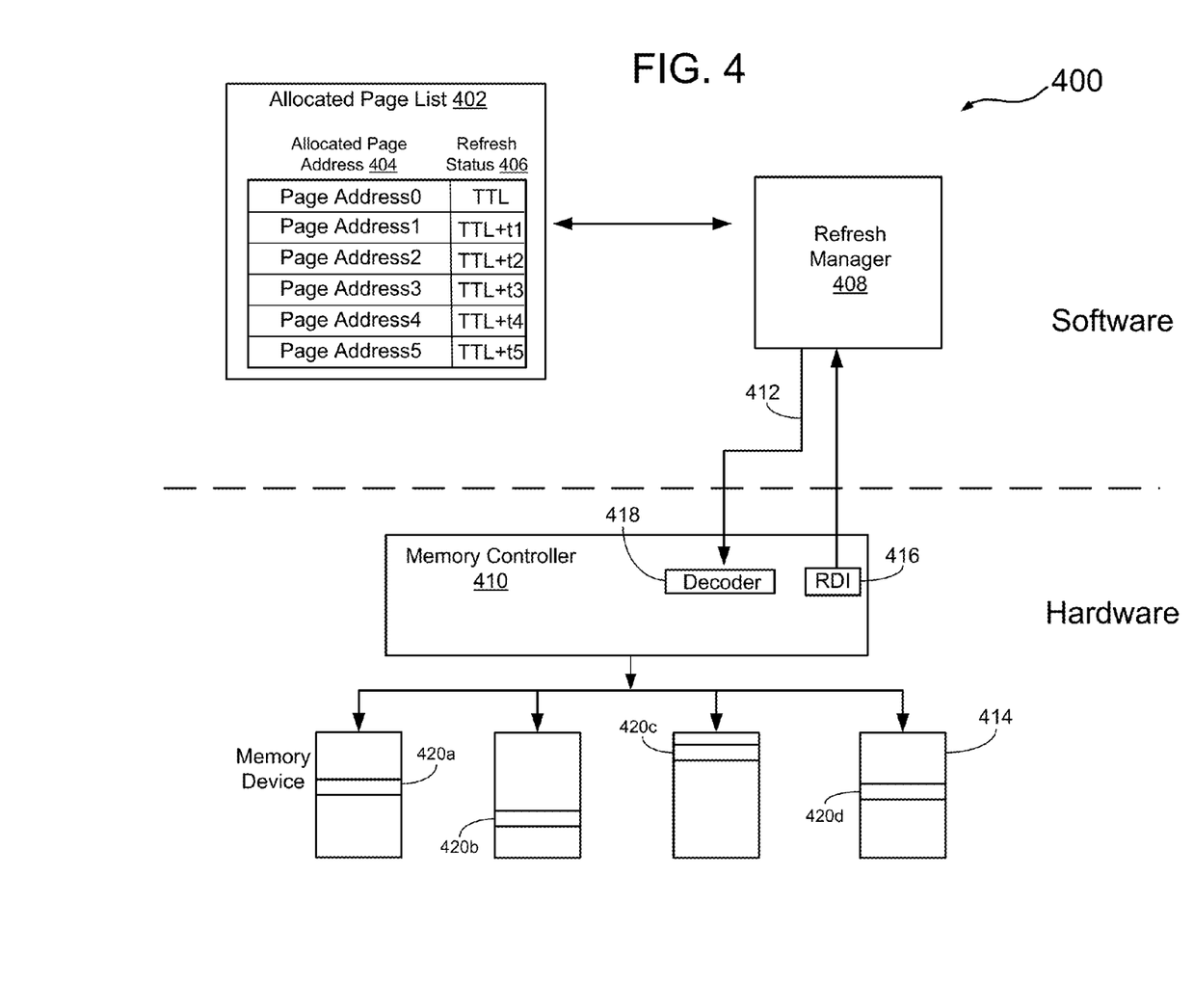
FIG. 4 illustrates further details of the software and hardware identified in the system of FIG. 2.

FIGS. 4-9 illustrate further details relating to various embodiments that are consistent with the system and method set forth above with respect to FIGS. 2 and 3. FIG. 4 illustrates further details pertaining to the software-to-hardware relationship between the operating system software 212 and the main memory 204. An allocated page list 402 is shown that identifies active memory by providing a first column 404 of allocated page addresses PAGE ADDRESS0-PAGE ADDRESS5 and a second column 406 that lists a refresh status parameter associated with each page address. In one embodiment, the refresh status parameter for each allocated page is a value generated by a decrementing timer that represents a remaining retention time or "time to live" (TTL) of the corresponding allocated page address. In a further specific embodiment, the allocated page addresses are sorted such that the allocated page address associated with the lowest count is the highest priority entry in the page list, and all subsequent times corresponding to other allocated pages are referenced to that count. For a current page, the TTL is the difference between a retention deadline information (RDI) value, and the TTL from the most recent previous page. This has a benefit of reducing map table checking overhead since it only needs to check the first page of the list.

Once the highest priority entry in the allocated page list 402 decrements its refresh status count to zero (or some other predetermined threshold), a refresh manager 408 detects the condition and generates refresh instructions for the allocated page in terms of its virtual memory space. The instructions are sent to a memory controller 410 (such as the controller corresponding to the memory controller 208 in FIG. 2) via a refresh instruction path 412. In order to determine the refresh status times, the operating system software obtains the retention deadline information (RDI) associated with one or more memory devices 414 at system boot-up from a control register 416 disposed on the memory controller 410. The memory controller 410 receives the instructions and utilizes a decoder 418 to translate the software-generated instructions that are in terms of physical memory into command signals in terms of physical memory and appropriate for memory device control. The commands are then distributed to the various memory devices 414 to refresh those portions of active memory, such as at 420a-420d corresponding to the OS-identified allocated page needing refresh.

Figure 5:
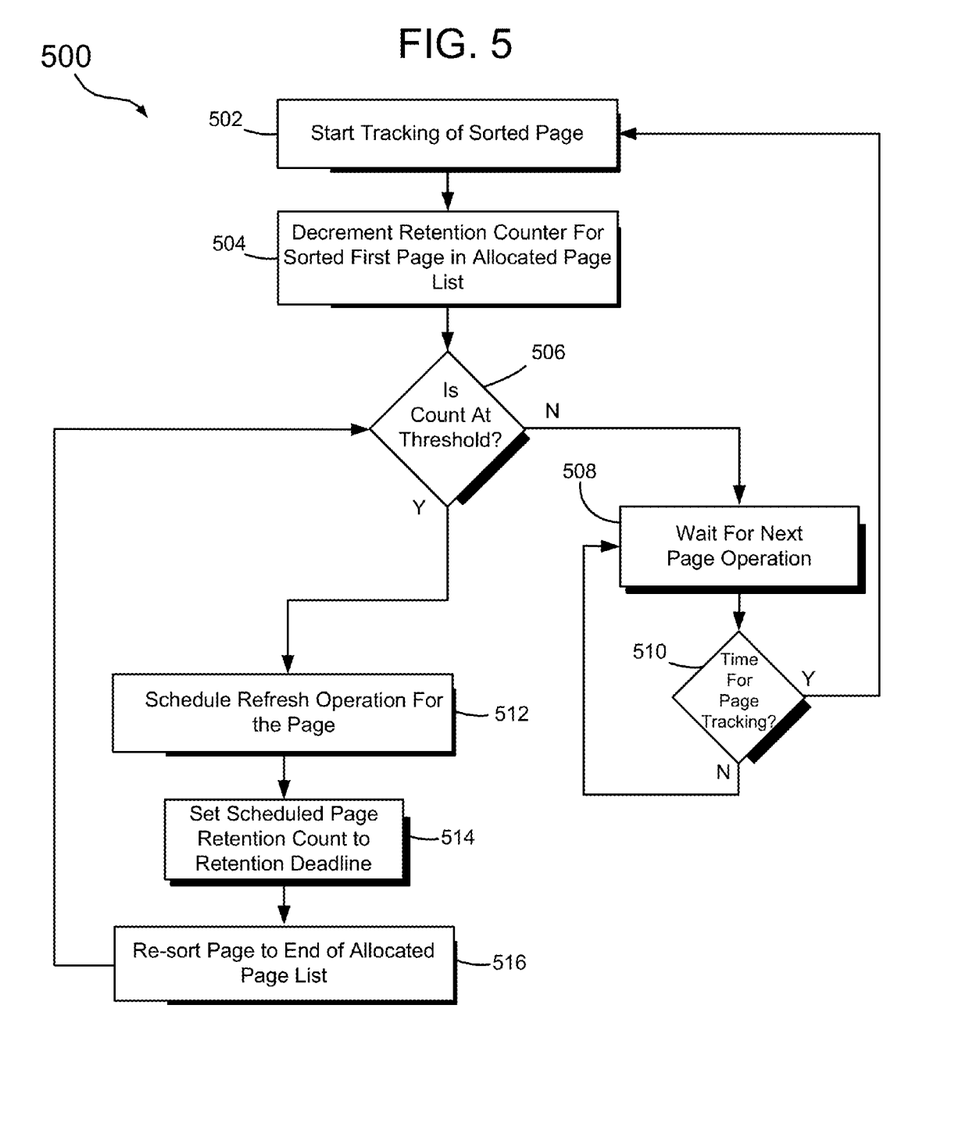
FIG. 5 illustrates a flowchart identifying steps employed in one embodiment of an allocated page tracking flow for the allocated page list of FIG. 4.

FIG. 5 illustrates an allocated page tracking method in accordance with one embodiment consistent with the software-to-hardware configuration described with respect to FIG. 4. As noted above, in one embodiment, the pages identified in the allocated page list are sorted in order of the page having the lowest "time to live" (TTL) count. Once the highest priority page is sorted and identified, it is tracked, at step 502. The TTL count for the sorted first page is then decremented in response to a periodic timing reference, such as a system clock, at step 504. A determination is then made regarding the count value, at step 506. If the count is above "0" or some other given threshold, then the software waits for the next page tracking operation, at step 508. If it is not time for a next page tracking operation, at step 510, the process continues to wait, at 508. The wait state will continue until a signal indicating the next page tracking operation is detected, at step 510. When the next page tracking operation is detected, the page tracking method reverts back to tracking a newly sorted highest priority page, at step 502.

Further referring to FIG. 5, if the count reaches "0", or some other designated threshold when evaluated at step 506, the refresh manager 408 schedules a refresh instruction for the page, at step 512. Once the refresh instruction is scheduled, the next-highest page is then treated as the highest-priority page, and the scheduled page retention count is set relative to the previous pages retention count, at 514. In this manner, the current page's TTL equals the RDI value minus the TTL of the previous page. The allocated page address is then re-sorted to the end of the allocated page list 402, at 516.

Figure 6:
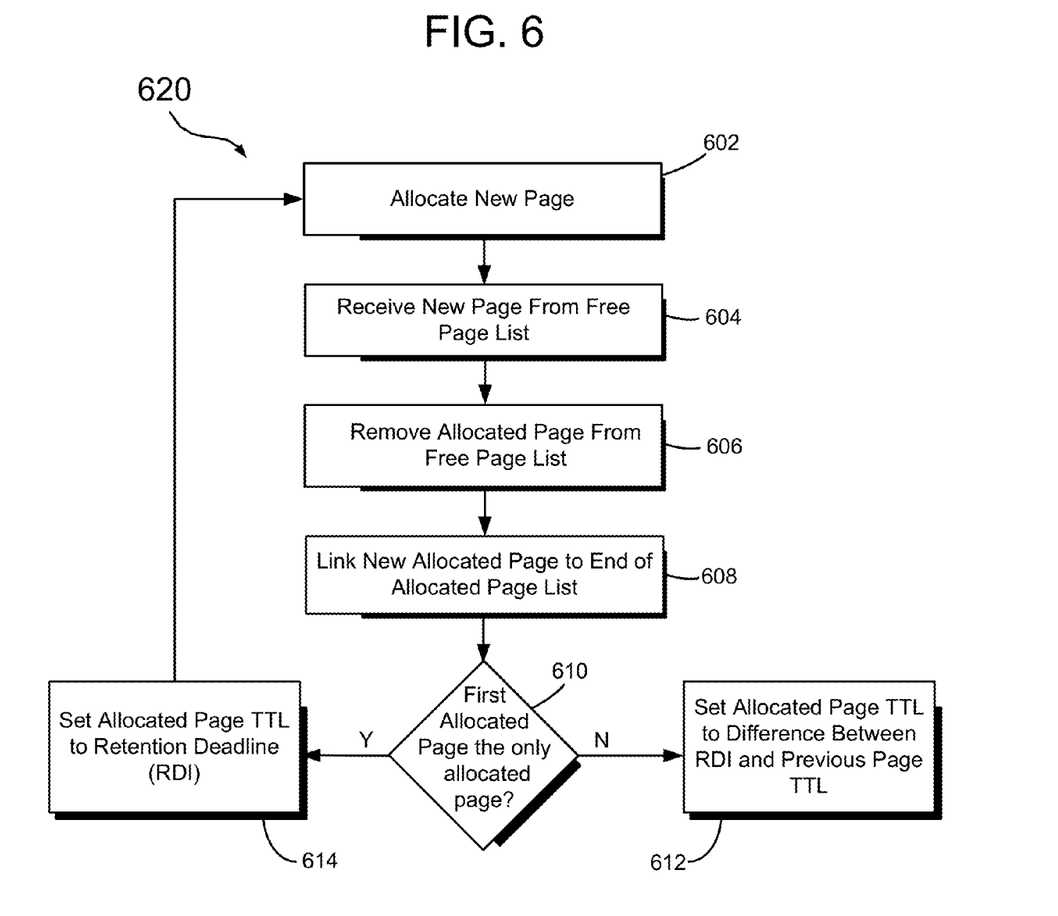
FIG. 6 illustrates a flowchart of steps representing one embodiment of a new page allocation process flow for the page table of FIG. 4.

In many situations, the operating system software 212 will update the system memory usage such that new pages may be added to allocated memory. FIG. 6 illustrates a flowchart identifying steps for a method of allocating new pages to the allocated page list 402 (FIG. 4). The method involves first allocating a new page entry to the allocated page list 402, at 602. Information concerning the new page is then received from the free page list 108 (FIG. 1) in the operating system software, at step 604, and removed from the free page list 108, at 606. The new allocated page is then linked to the end of the allocated page list 402, at 608. If the new allocated page is the only allocated page, at 610, then the new allocated page's time to live count TTL is set to match the retention deadline information (RDI) retrieved at system boot-up. If the new page is not the only allocated page, then the allocated page TTL value is set to a difference between the retention deadline information RDI and the previous page TTL value, at step 612.

Figure 7:
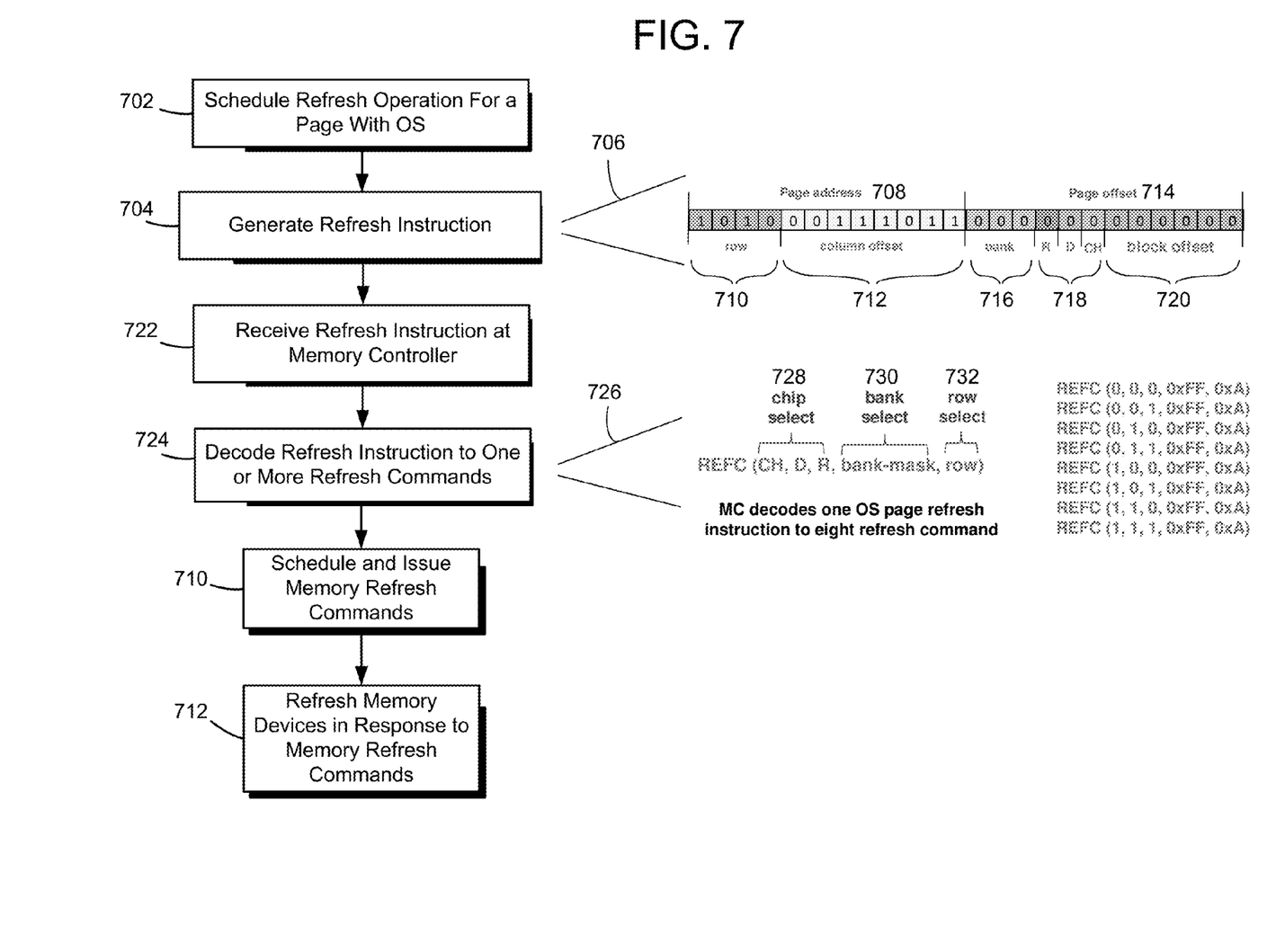
FIG. 7 illustrates a method of generating refresh instructions and corresponding refresh commands.

FIG. 7 illustrates further detail relating to one embodiment of a method of generating refresh instructions by the refresh manager 408 (FIG. 4), and decoding the OS-generated refresh instructions by the memory controller decoder 418. As a given refresh operation corresponding to a page of memory is scheduled, at step 702, the operating system software generates a refresh instruction for the page, at step 704. As shown in the blowup detail at 706, the information or "page mapping" associated with one embodiment of a refresh instruction includes a physical memory page address 708 that includes a row address 710 and a column offset address 712. A page offset 714 is also identified, including bank information 716, rank, channel and DIMM information 718, and a block offset value 720. Once the refresh instruction is generated by the refresh manager 408, it is dispatched to the memory controller 410.

Further referring to FIG. 7, the memory controller 410 receives the refresh instruction, at step 722, and decodes the instruction into one or more refresh commands, at step 724. As shown in the blowup detail at 726, one specific embodiment involves decoding each OS page refresh instruction into eight refresh commands. Each command includes information relating to chip select values 728, a bank select value 730 and row select value 732. Eight exemplary commands are shown corresponding to the basic command structure.

Once the memory commands are generated, the memory controller 410 schedules the commands into appropriate queues and issues the commands to the one or more memory devices 414 corresponding to the page, at step 710. The addressed portions of the one or more memory devices are then refreshed in response to the commands, at step 712. Should the system initiate a self-refresh mode of operation, further refresh instructions initiated by the operating system software are halted, and instead, refresh activities are carried out solely on the memory devices 414 as more fully described with respect to FIGS. 8 and 9.

Figure 8:
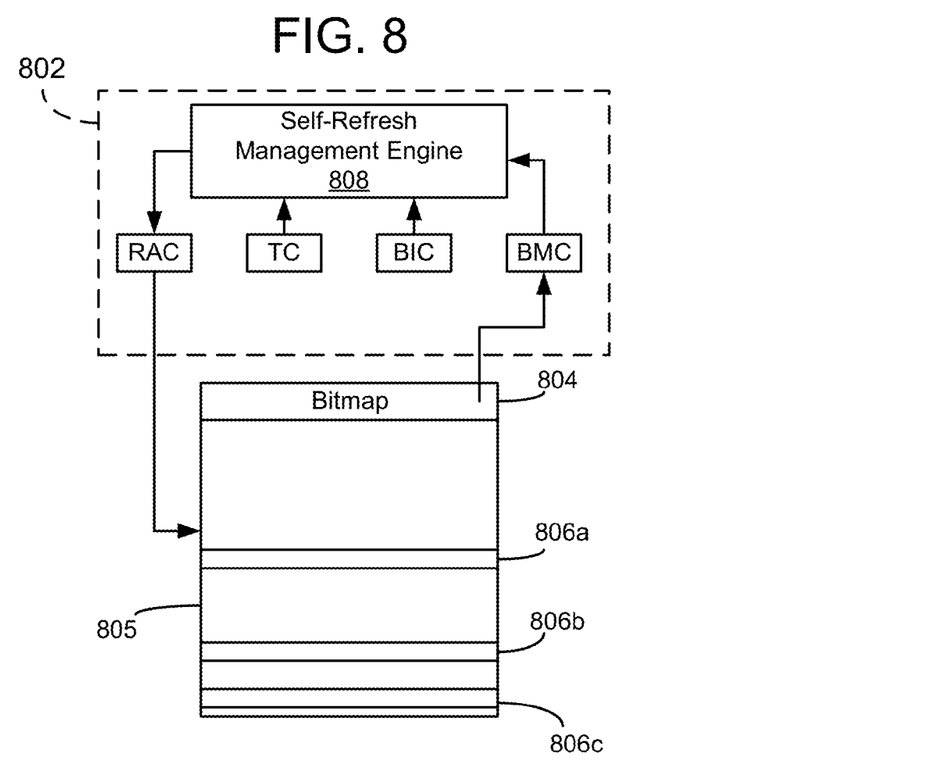
FIG. 8 illustrates a block diagram of one embodiment of a self-refresh circuit for the memory device of FIG. 2.

Referring now to FIG. 8, each memory device 414 in the main memory includes self-refresh hardware 802 that allows each memory device 414 to carry out refresh operations internally without external commands from outside the device. Generally, self-refresh is employed as a low-power mode of operation for each memory device to enable each device to retain its stored information while a system clock is shut down. This, in essence, puts the memory device 414 into a "sleep" mode. Selective refresh of only the portions of the memory device 414 that are active or allocated thus provides even further power saving benefits over and above just shutting down the system clock.

In one embodiment, the refresh hardware 802 interfaces with a bitmap portion 804 of each memory device 414. The bitmap portion stores a bitmap representation of the active memory map (such as 216, FIG. 2) used in the standard refresh mode. One specific embodiment employs one bitmap per bank 805, with each row (such as 806a-806c) of the bank represented by a single bit in the bitmap 804. The state of each bit indicates whether or not the corresponding row has been allocated to system memory or "active." Thus, for a bank of 16K rows, a suitable bitmap has a size of 16K bits. In other embodiments, instead of loading information representing the active memory map into a bitmap portion of the device, storage locations such as the active memory itself, or tag memory coupled to the active memory within the memory device 414 may be loaded with information corresponding to the active memory map.

Further referring to FIG. 8, the self-refresh hardware 802 takes the form of a state machine that includes a self-refresh management engine 804 that interfaces with a variety of counters to control the self-refresh operations. The counters include a timer counter TC, a refresh address counter RAC, a bitmap counter BMC and a bitmap index counter BIC. The timer counter TC generally tracks the refresh interval time while the refresh address counter RAC increments through the bank row addresses for refreshing. The bitmap counter BMC provides a bitmap of a set number of rows, such as sixty-four, to self-refresh and during operation is compared against the refresh address counter RAC when the timer counter TC expires to determine whether a refresh is needed. The bitmap index counter BIC provides an address index of the bitmap for a subsequent bitmap counter fetch, and in one embodiment provides 8 bits for 16K rows.

Figure 9:
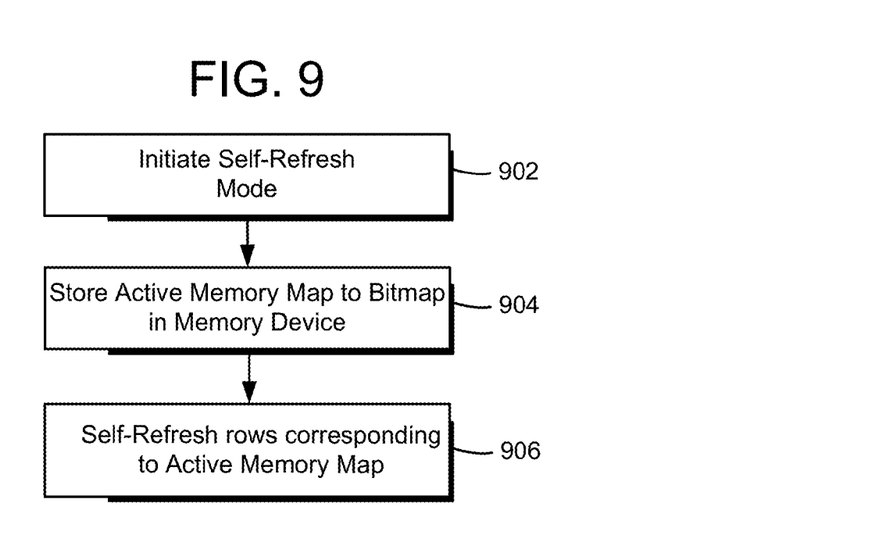
FIG. 9 illustrates a high-level process flow for the self-refresh circuit of FIG. 8.

FIG. 9 illustrates a high-level process flow for a self-refresh method that utilizes the self-refresh hardware 802 of FIG. 8. Once the computing system initiates a self-refresh mode of operation, at step 902, a bitmap version of the active memory map 216 stored in active memory is loaded to the bitmap blocks 804 of the memory devices undergoing self-refresh, at step 904. The memory device state machine hardware then traverses the bitmap information and refreshes the rows that have a corresponding bit in the bitmap indicating the row's allocation in active memory. With the bitmap index counter BIC keeping track of the row and column addresses of where the state machine is at with respect to refreshing the memory device rows, the bitmap counter BMC periodically fetches a block of 64 rows (a subset of the bitmap) for refreshing every interval of n cycles. The interval is based on the timer counter TC and the number of rows in the block to be refreshed. When the system exits the self-refresh mode of operation, the operating system software 212 regains control over the memory refresh operations as described above with respect to the standard refresh mode.

Those skilled in the art will appreciate the benefits and advantages afforded by the embodiments described herein. Selectively refreshing only those memory locations that are allocated to active memory provides significant power savings due to reductions in refresh current. Moreover, handling selective refresh via a software-based scheme that tracks the allocated memory reduces implementation costs and complexity. By providing ways to selectively refresh active memory in both standard and self-refresh modes, further power savings may be realized.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of refreshing a memory, the method comprising:
   accessing, from active memory, an active memory map generated by operating system software, the active memory map reflecting a first prioritization of in-use memory;
   identifying addresses corresponding to the active memory and associated refresh criteria for the addresses;
   wherein during each refresh period $T_{REF}$, the operating system operative to
   carry out a second prioritization by ranking a first refresh status for a first portion on of the in-use memory with respect to a second refresh status for a second portion of the in-use memory, the ranking representing a relative priority for refreshing the first portion of the in-use memory with respect to the second portion of the in-use memory;
   initiate a refresh instruction to refresh the first portion of the active memory based on the first prioritization and the ranking of the second prioritization; and
   update the first refresh priority status for the first portion of the active memory following issuance of the refresh instruction.

2. The method of claim 1, further comprising:
   decoding the refresh instructions to generate one or more memory refresh commands; and
   refreshing the first portion of the active memory in response to the one or more memory refresh commands.

3. The method of claim 1 wherein accessing the active memory map comprises accessing an allocated page table, and wherein the interval between successive refresh instructions is at least 650 ms.

4. The method of claim 3 wherein accessing the allocated page table comprises:
   tabulating plural active memory page addresses; and
   tracking a refresh status for each active memory page address.

5. The method of claim 4 wherein tracking the refresh status comprises:
   monitoring the refresh time interval associated with the first portion of the active memory; and
   sorting the active memory page addresses based on the monitoring to generate the first refresh priority status.

6. The method of claim 1 and further comprising:
   selectively initiating a self-refresh mode, the self-refresh mode comprising
   loading information representing the active memory map into an addressable storage element of a memory device; and
   activating hardware in the memory device to selectively self-refresh the active memory of the memory device based on the loaded information.

7. The method of claim 6 wherein the storage element comprises tag storage coupled to the active memory in the memory device.

8. The method of claim 6 and further including:
   self-refreshing the storage region of the memory device.

9. The method of claim 6 wherein the loading information comprises bitmapping the information representing the active memory map into a storage region of the memory device, wherein a single bit of the bitmap represents the portion of active memory, and other single bits represent other equal-sized regions of active memory.

10. A method of managing memory refresh operations, the method comprising:
    in a first mode,
    generating an active memory map of the memory with operating system software, the active memory map reflecting a first prioritization of In-use memory, the active memory map having addresses corresponding to active memory allocated by the software,
    directing that the active memory map be stored in a location within the active memory,
    wherein during each refresh period $T_{REF}$, the operating system software operative to
    access the stored active memory map;
    carry out a second prioritization by ranking a first refresh status for a first portion of the in-use memory with respect to a second refresh status for a second portion of the in mac memory, the ranking representing a relative priority for refreshing the first portion of the in-use memory with respect to the second portion of the in-use memory:
    initiate a refresh instruction, to refresh the first portion of the active memory based on the first prioritization and the ranking of the second prioritization; and
    update the first refresh priority status for the first portion of the active memory following issuance of the refresh instructions.

11. The method of claim 10 further comprising:
    in a self-refresh mode,
    refraining from issuing refresh instructions to refresh the memory.

12. The method of claim 10 wherein generating the active memory map comprises:
generating an allocated page table listing page addresses corresponding to active memory in the memory.

13. The method of claim 12 wherein generating the allocated page table further comprises:
providing a tracking field for tracking a refresh status for each of the active memory page addresses.

14. A memory device comprising:
active memory including storage cells operable to store an active memory map, the active memory map generated by operating system software and reflecting a first prioritization of in-use memory, the active memory map to identify addresses of the active memory in the memory device;
in a first refresh mode, the storage cells operable, in response to refresh commands generated in response to refresh instructions initiated by the operating system software during a refresh period $T_{REF}$ that is at least 650 ms, to selectively refresh a first portion of the active memory corresponding to the active memory map, wherein the refresh commands for the first portion of the in-use memory are based on the first prioritization and a ranking of a second prioritization carried out by the operating system software, the second prioritization comprising ranking a first refresh status for the first portion of the in-use memory with respect to a second refresh status for a second portion of the in-use memory, the ranking representing a relative priority for refreshing the first portion of the in-use memory with respect to the second portion of the in-use memory: and
in a second mode, the storage cells operable, in response to self-refresh commands, to selectively refresh a portion of the active memory corresponding to a loaded bitmap version of the active memory map.

15. The memory device of claim 14 wherein the active memory map comprises an allocated page table.

16. The memory device of claim 14 and further comprising:
a self-refresh circuit operable in the second mode to generate the self-refresh commands based on the bitmap version of the active memory map.

17. A method of operating a memory device having storage cells, the method comprising:
in a first mode,
storing an active memory map of memory addresses corresponding to active memory in active memory of the memory device and reflecting a first prioritization of in-use memory, the active memory map generated by operating system software;
accessing and transferring the active memory map as read data in response to a read request, the read request generated by a memory controller in response to a first instruction issued by the operating system software;
receiving refresh commands from the memory controller to selectively refresh only the memory addresses identified in the transferred active memory map, the refresh commands responsive to refresh instructions issued by the operating system software during each refresh period $T_{REF}$, wherein the refresh commands for a first portion of the in-use memory are based on the first prioritization and a ranking of a second prioritization carried out by the operating system software, the second prioritization comprising ranking a first refresh status for the first portion of the in-use memory with respect to a second refresh states for a second portion of the in-use memory, the ranking representing a relative priority for refreshing the first portion of the in-use memory with respect to the second portion of the in-use memory; and
wherein the refresh period $T_{REF}$ is at least 650 ms.

18. The method of claim 17 and further comprising:
in a second mode,
storing a version of the active memory map in a bitmap region of the memory device; and
self-refreshing only active memory corresponding to the active memory map.

19. A memory controller comprising:
a host interface to receive refresh instructions initiated by operating system software during each refresh period $T_{REF}$, the refresh instructions based on an active memory map of a memory, the active memory map generated by the operating system software under control of a host device and reflecting a first prioritization of in-use memory, the refresh instructions for a first portion of the in-use memory based on the first prioritization and a ranking of a second prioritization carried out by the operating system software, the second prioritization comprising ranking a first refresh status for the first portion of the in-use memory with respect to a second refresh status for a second portion of the in-use memory, the ranking representing a relative priority for refreshing the first portion of the in-use memory with respect to the second portion of the in-use memory;
decoder circuitry operable to generate memory device address-specified refresh command signals based on the refresh instructions;
a memory interface to issue the refresh command signals to the memory; and
wherein an interval between successive refresh instructions issued by
the operating system software is at least 650 ms.

20. The method according to claim 1, wherein the refresh period $T_{REF}$ comprises a time interval between successive refresh operations directed to the same portion of the active memory.

* * * * *